Figure 1:
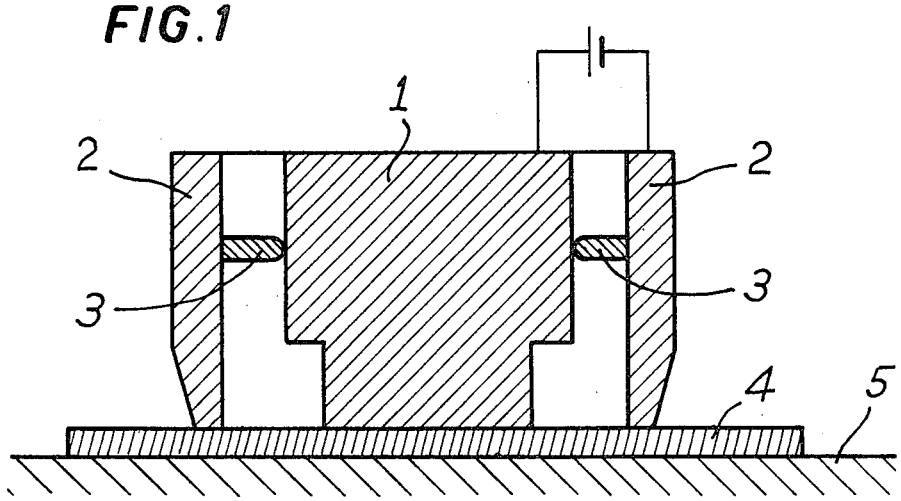

United States Patent [19]

Terliska

[11] 4,265,703

[45] May 5, 1981

[54] METHOD OF PREPARING A FIBROUS STRUCTURE CONTAINING METALLIC FIBERS

[75] Inventor: Jacques Terliska, Rives, France

[73] Assignee: Arjomari-Prioux, Paris, France

[21] Appl. No.: 39,151

[22] Filed: May 15, 1979

[30] Foreign Application Priority Data

May 17, 1978 [FR] France .............................. 78 14617

[51] Int. Cl.$^3$ .............................................. D21H 5/18
[52] U.S. Cl. ................................ 162/146; 162/157 C; 162/175; 162/168 R; 162/182
[58] Field of Search ............... 162/157 R, 182, 168 R, 162/175, 148, 146, 183; 428/377–379, 280, 288, 600

[56] References Cited

U.S. PATENT DOCUMENTS 3,067,087  12/1962  Gorski et al. .................... 162/157 R

OTHER PUBLICATIONS

Battista "Synthetic Fibers in Paper Making" (1964) pp. 70, 120–137, 156–161, 166–169, 178–180.

*Primary Examiner*—Peter Chin
*Attorney, Agent, or Firm*—Bacon & Thomas

[57] ABSTRACT

This invention relates to a fibrous structure containing metallic fibers, said fibrous structure being characterized in that the fibers which constitute said fibrous structure have been deposited by wet process, and in that the metallic fibers which said fibrous structure contains possess at their surface traces of a hydrosoluble binder, which has served initially for coating said metallic fibers.

This invention relates also to the method of preparing said fibrous structure and also to its application, notably in the production of security papers, metallic filtering elements and elements for protection against electromagnetic waves.

4 Claims, 2 Drawing Figures

U.S. Patent

May 5, 1981

4,265,703

METHOD OF PREPARING A FIBROUS STRUCTURE CONTAINING METALLIC FIBERS

This invention relates to a fibrous structure containing metallic fibers, to the method of preparing said fibrous structure and to its application, notably in the papermaking industry.

More specifically the objective of the invention is a coherent structure of fibers deposited by a wet process, such as paper, and comprising metallic fibers and, where applicable, fibers of other types.

It is known, notably from French Pat. No. 1,150,689, that sheets of metallic fibers may be prepared by a non-papermaking technique starting from a dispersion of said fibers in a liquid medium and that the sheet thus obtained may be consolidated by sintering. It is also known from the publication by O.A. BATTISTA "Synthetic Fibers in Papermaking" pages 118–184 (John Wiley & Sons, New-York, 1964) that fibrous structures containing metallic fibers have been prepared by wet process in accordance with a technique which necessarily implies sintering of the fibrous sheet (see in this respect the table on page 167 of said work).

It is known that in the past the incorporation of metallic fibers into an organic fibrous sheet (such as paper) or mineral fibrous sheet (such as glass fibers) gave rise to numerous difficult technical problems. In fact, metallic fibers have a specific gravity which is fairly high by comparison with the other organic and mineral fibers and, consequently, they disperse very ineffectively, particularly in cellulose fiber pastes. In addition, it has been found that metallic particles adhere rather ineffectually to the fibers constituting paper and that, under the action of mechanical stresses (notably rumpling and folding) these metallic particles tear the paper and/or are pushed out of the paper.

In order to alleviate these technical difficulties, it has been envisaged in the prior art that metallised fibers or textile fibers impregnated with magnetic ink may be used. Thus, according to French Pat. No. 2,323,812, it is known to incorporate synthetic or mineral fibers metallised at the surface into security papers for the purpose of conferring upon them a specific character (for example electrical conductivity) so as to render their imitation or falsification more difficult.

The surface metallisation of natural or synthetic fibers is generally a relatively simple treatment. Moreover, the incorporation of these metallised fibers into the paper hardly presents any technical problems since they disperse very easily and uniformly, even at high concentrations, because their specific gravity is close to that of the cellulose fibers.

Nevertheless, metallised fibers possess a disadvantage since, by reason of the metallisation, the quantity of metal in relation to fibers constituting the fibrous sheet remains small. This is why the properties proper to this metal remain difficult to exploit. Finally, the metallisation process really limits the choice of the metal to aluminium; in fact, if aluminium is not used, metallisation has to be carried out under a high vacuum and it then involves the use of complicated techniques and devices.

It is an objective of this invention to alleviate the disadvantages inherent in metallised fibers and to recommend means permitting the incorporation of purely metallic fibers into a paper or into a similar fibrous structure. In addition, according to this invention, very specific detecting and monitoring means are proposed, which are useful notably for security papers. These means comprise notably devices for detecting the principal properties due to the metallic fibers, such as: electrical conductivity, magnetism, electromagnetic wave absorption capacity, thermal conductivity. It is of course to be understood that, in addition to these devices, visual detection means, for example by transparency, may also be used. The degree of security, that is to say the difficulty of imitating or falsifying a security paper, increases with the degree of detail in its composition: in the present case, the metallic fibers in themselves constitute a very high degree of originality; to this originality is added the difficulty of incorporating them homogeneously into the paper sheet. With this objective, the detection methods should remain as simple as possible and, at the same time, should be specifically adapted to the nature of the metallic fibers.

It has now surprisingly been found that, in spite of the bad distribution of the metallic fibers in aqueous suspensions of natural or synthetic fibers due to the difference in specific gravity, it has been possible to prepare by a wet process and in accordance with a conventional papermaking technique a fibrous structure containing metallic fibers, starting from a homogeneous aqueous dispersion comprising, on the one hand natural or synthetic fibers and, on the other hand metallic fibers previously treated with a hydrosoluble binding agent, the homogeneous character of the aqueous dispersion being achieved as a result of the presence of traces of said binding agent on the metallic fibers, and said homogeneous character permitting a uniform distribution, where necessary of a localised nature, of said metallic fibers in the fibrous structure produced by a wet process on the cloth of the papermaking machine.

According to this invention there is proposed, as a new industrial product, a coherent fibrous structure containing metallic fibers, characterised in that the fibers which constitute said fibrous structure have been deposited by wet process, and in that the metallic fibers contained by said fibrous structure possess on their surface traces of a hydrosoluble binding agent which has served initially for coating said metallic fibers.

The minium quantity of metallic fibers contained in the fibrous structure according to this invention depends upon the use to which it is intended that the structure shall be put. Thus, for example, a fibrous structure containing 0.01% by weight of metallic fibers, may be prepared. In practice, the minimum quantity of metallic fibers contained in the fibrous structure will be 0.1% by weight relative to the weight of said fibrous structure and preferably 0.5% by weight thereof.

According to one of the characteristics of the invention, the quantity of metallic fibers ranges from 0.1% to 95% by weight relative to the weight of the fibrous structure. According to this characteristic, the fibrous structure contains 0.1 to 95% by weight of metallic fibers and from 99.9 to 5% by weight of a mixture of natural or synthetic non-metallic fibers and conventional papermaking additives, such as fillers, impregnation agents etc.

According to another of the characteristics of the invention, the fibers of the fibrous structure are only metallic fibers.

In the following, the expression "other fibers" or "non-metallic fibers" designates not only natural or synthetic textile fibers adapted to be used in the manufacture of paper, such as cellulose fibers, or fibers of PVA, polyethylene, polyester, but also mineral fibers such as carbon fibers, glass fibers and ceramic fibers and, where applicable, metallised fibers. The preferred non-metallic fibers are cellulose fibers, and these may be associated with other non-metallic fibers.

The metallic fibers of the fibrous structure according to this invention still possess at their surface traces of the hydrosoluble binding agent with which they have been treated. This binding agent, discernible under the microscope, constitutes an additional security element. It should be noted that the metallic fibers previously treated with this binding agent, before the forming of the fibrous structure by wet process, are not present in an isolated form but, by contrast, in the form of an agglomerate of metallic fibers and binding agent. The traces of binding agent represent 5 to 20% of occupied surface relative to the surface of the metallic fibers.

It is sometimes advantageous, in regard to the preparation of the fibrous structure, to have recourse to metallic fibers having dimensions of the same order of magnitude as those of the other fibers forming part of the composition of said fibrous structure, or from 1 to 10 mm. Nevertheless, this question of analogous dimensions is not essential. In practice, use will be made of metallic fibers having preferably a mean diameter less than or equal to $30\mu$ (where applicable less than $10\mu$) and a length less than or equal to 10mm and preferably of a length comprised between 3 and 6 mm. It is nevertheless possible to use metallic fibers possessing different dimensions in regard to at least one of the following elements: the diameter, the length, the cross-section and the longitudinal section.

These metallic fibers may be produced by drawing a bundle of metallic wires such as described in U.S. Pat. No. 2,050,298.

It is also possible to make use of metallic fibers having cross-sections of different shapes, for example round, oval, rectangular, square, triangular, or shaped as an L, T or Y. It is also possible to use metallic fibers having a section which varies in the longitudinal direction, as described in U.S. Pat. No. 3,698,863.

According to another characteristic of this invention, the preferred metallic fibers are those which have a rough surface. In particular, it has been found that non-smooth surfaces, notably those which comprise longitudinal striations, improve the cohesion of the metallic fibers with the other non-metallic fibers and notably cellulose fibers.

Generally speaking, the metallic fibers may have any composition: aluminium, copper, stainless steel, titanium, nickel, lead, tantalum, etc., metallic oxides (notably oxides of Cu, Al, Fe, Ti, Ni, Mo, Pb, V, Ta) and alloys. These fibers may even have a bimetallic structure, notably of the core-sheath type.

With the objective of detecting them in the fibrous structure by magnetic methods, the metallic fibers may themselves possess a magnetic or magnetisable character. As a result of their magnetic properties, these metallic fibers may also be oriented in predetermined directions during their deposition by wet process on the cloth of the papermaking machine, by suitably arranging magnets in the vicinity of this cloth.

In addition, it is possible to incorporate the metallic fibers into the coherent structure in a controllable manner, that is to say at limited locations and with predetermined concentrations either at the surface or within the thickness of the structure, for example in the form of bands or strips. Surface depositing in strips is usually carried out by the provision of a secondary tank, containing the dispersion of metallic fibers, above the wet section of the usual papermaking machine and extending over only a portion of the width of the paper. For a preferential deposition within the thickness or depth of the structure, it is possible for example to proceed as follows: a dispersion containing cellulose fibers or metallic fibers in the desired concentration is formed by a papermaking process, and this fibrous sheet is then covered on both sides with sheets which are similar but without any metallic fibers. The bringing together of these sheets may be carried out either on a machine equipped with several flat tables or outside the papermaking machine by pasting together.

Clearly, it is possible to deposit metallic fibers of different compositions, for example magnetic or magnetisable fibers and other metallic fibers. It may also be useful to deposit metallic fibers of different compositions at limited locations, notably in the form of a series of juxtaposed strips, each strip then possessing a different composition and at desired concentrations.

Where it is desired to prepare a fibrous structure containing only metallic fibers, all that is necessary is to disperse the metallic fibers is the presence of a binding agent, provided that this binding agent is present in the form of fibers soluble in hot water or melting with heat. In the presence of cold water, these fibers permit dispersion of the metallic fibers, while during drying they solubilise or melt and thus assure the bond between the metallic fibers. This result is of advantage where it is desired to avoid the presence of cellulose.

The binder used is with advantage a water-soluble substance, since water is used as dispersion medium in the papermaking industry, such as for example polyvinyl alchohol or starch, the preferred binding agent being polyvinyl alchohol. During the addition of the metallic fibers treated with the binding agent, in the wet section of the papermaking machine, the binder partly dissolves, so that the fibers become progressively separated. In addition, agitation of the fibrous paste using agitators as currently employed in the papermaking industry promotes a complete, rapid separation and assures uniform distribution of the metallic fibers in the paste.

The method of preparing according to this invention a fibrous structure by wet process, which contains metallic fibers, is characterised in that:

(a) metallic fibers are subjected to a treatment by means of a hydrosoluble binding agent, so as to produce an agglomerate of fibers and binder;

(b) an aqueous dispersion is prepared by mixing together, with stirring, the thus obtained agglomerate, non-metallic fibers and water; and (c) starting from the thus obtained aqueous dispersion, the formation of the fibrous structure by wet process is carried out, in the form of a sheet.

The treatment according to stage (a) is with advantage carried out by coating the metallic fibers with a hydrosoluble binder, selected notably from the group composed of polyvinyl alchohol and starch.

Although the preparatory treatment of the metallic fibers with a binder substantially improves the dispersibility of the metallic fibers in the paste, it has been proved advantageous to add to these metallic fibers yet other fibers before the application of the binder. After the incorporation of this mixture into the coherent structure, traces of the binder are found also on these other fibers.

In principle, the metallic fibers with a length generally less than 10 mm and diameter less than 30μ are present in a disordered manner in the agglomerate. Preferably, however, they are arranged there parallel, which gives the agglomerate a form like a ribbon with a length of 10 mm at most in the longitudinal direction of the fibers, a width of less than 15 mm and a thickness of less than 3 mm. It would be possible to reduce the specific gravity of an agglomerate of metallic fibers alone by increasing the proportion of binder therein. However, the larger quantity of binder to be disintegrated would then require a temporary dispersion action of greater energy or greater duration, which is undesirable.

In fact, the binder in the fibers agglomerate does not in general possess a continuous matrix in which the fibers are entirely coated with binder, but possesses hollows. As a result of these hollows, the specific gravity of an agglomerate comprising, for example, less than 20% by volume of non-metallic fibers remains low.

The fibers agglomerates of ribbon-like form as described above may be prepared in the following way: a bundle of metallic filaments, produced for example according U.S. Pat. No. 2,050,298, is passed axially with a plurality of other filaments through an impregnation bath containing the disintegrable binder. The impregnated composite bundle is then dried and then cut transversely into pieces of at most 10 mm length. The concentration of the binder in the bath and also the viscosity of the bath determine the quantity of binder entrained by the bundle. When a bundle of metallic filaments alone is impregnated, it is advantageous to have a considerable quantity of binder between the filaments in view of the subsequent cutting, since the binder matrix will then serve as material for separating the filaments, and a metallic bond by cold welding of the metal ends under the transverse cutting pressure of the blades is avoided. However, a high quantity of binder is a drawback from the aspect of dispersion treatment in the papermaking paste. However, the incorporation of other fibers into the bundle fulfils the role of separating material between the metal filaments so that, on the one hand the disadvantage of connections between the metal ends during cutting and, on the other hand the need to apply a too high quantity of binder, are avoided.

The bundle of metallic filaments may be sandwiched between two bundles of other fibers, so that the metallic fibers, after cutting, are preferentially located at the centre of the ribbon. On the other hand, bundles of non-metallic filaments may be sandwiched between bundles of metallic filaments in order to arrange the metallic fibers preferentially at the periphery of the ribbons.

It is evident that in principle metallic filaments of differing diameter, cross-sectional shape, composition, magnetic properties and/or roughness, and also bimetallic fibers, can all be considered for forming part of the agglomerate. Likewise, all sorts of other fibers may be incorporated into the agglomerate and thence into the coherent structure, for example natural or synthetic fibers, high-temperature resistant fibers such as notably the fibers sold commercially under the trade mark names of Nomex and Kermel; glass fibers; carbon fibers, etc., and the other fibers may be metallised so that the coherent structure may comprise an assembly of synthetic or natural fibers and mineral fibers and also an assembly of metallised fibers and non-metallised fibers.

Generally speaking, the duration of stage (b) will depend upon the time required for dispersing all the fibers of the agglomerate. This duration is approximately from 15 to 30 minutes.

In stage (c) the dispersion, possibly diluted with water, is introduced at the head of the papermaking machine at the wet section. Generally speaking, from 0.1 to 95% by weight of metallic fibers relative to the weight of the fibrous structure may be used. When a fibrous structure is desired which shall contain only metallic fibers, the procedure is as indicated above.

Other advantages and characteristics of the invention will be better understood from the description given below of examples of embodiment, which are in no way limiting but given merely for purposes of illustration.

EXAMPLE 1

A bundle of 10,000 roughened filaments of stainless steel of type 316 L and 12μ diameter (manufactured by the company N. V. BEKAERT S.A., at Zwegen, Belgium) is guided by a system of rollers through a bath containing a solution of polyvinyl alchohol. On leaving the bath the bundle, more or less flattened transversely, is passed above a heating plate so as to dry the binding agent and consolidate the impregnated bundle. The bundle is then passed axially through a cutting apparatus and pieces or agglomerates are cut into pieces of length 5 mm, thickness about 2 mm and width about 8 mm. Microscopic examination shows that the binding agent in the bundle is distributed in the form of separate strokes between the fibers.

EXAMPLE 2

A suspension is prepared containing by weight 1000 parts of water to 8 parts of metallic fibers (of diameter 12 microns, length 5 mm) produced in the form of agglomerate as indicated in example 1 and 2 parts of cellulose. After 20 minutes thorough agitation, the metallic fibers are well separated from one another. The suspension is then added continuously to a formulation for standard paper. The flow rate is regulated so that the concentration of metallic fibers is 0.5% by weight relative to the paper. The paper thus obtained may be used as a base for a security paper for bank notes, deeds or passports.

EXAMPLE 3

An aqueous suspension is prepared as indicated in example 2. This suspension is not distributed homogeneously throughout the volume of the paper, but it is added onto the paper sheet in the wet section so as to become deposited along a narrow surface in the form of a continuous strip. This paper can also serve as a support for a security paper.

EXAMPLE 4

The fibers of example 2 being introduced at the head of the papermaking machine according to the method of example 2, an electromagnet is disposed in the wet section where the sheet starts to form on the cloth of the machine. It is thus possible to orient the metallic fibers as desired, and in particular to cause them to adopt an orientation perpendicular to the preferential orientation, which is that of the direction of travel of the paper.

If the same fibers are deposited according to the method of example 3, the same electromagnet is disposed in the vicinity of the place where the metallic fibers become deposited on the paper. In this case, once again, the metallic fibers are oriented as desired.

In these conditions, it is possible to obtain spectrums representative of the magnetic field and these spectrums, due to their localisation and their magnetic signature, are of extreme value for security documents.

EXAMPLE 5

An aqueous dispersion is prepared as indicated in example 2. This dispersion, diluted about 10 times with water, is utilized just as it is for the production of a paper containing 80% by weight of metallic fibers relative to the weight of said paper. This paper can be utilized as a metallic filtering element.

EXAMPLE 6

A suspension is prepared containing by weight 1000 parts water, 8 parts metallic fibers (of diameter $12\mu$, length 5 mm) produced as indicated in example 1, and 2 parts of polyvinyl alchohol fibers. After 20 minutes agitation, the assembly of fibers is thoroughly dispersed. This dispersion is diluted with water and then used as it is on the papermaking machine. The thus obtained paper, which comprises only metallic fibers, can be used as a metallic filtering element.

A summary is given below of the properties of the paper obtained according to the method of example 2.

In order to establish the authenticity of the paper, detections of the metallic fibers can be made qualitatively or quantitatively, for example in order to determine the concentration and also the localisation of the metallic fibers present. A first qualitative examination is carried out using a Testafa 2000 apparatus by the Firm Reiners Elektronik. This pocket apparatus enables the presence of metallic fibers to be detected by their electrical conductivity, even at as low a concentration as 0.5% by weight metallic fibers in the paper.

A second qualitative examination is based upon the magnetic properties of the paper. It is observed that a magnetic attraction becomes very clearly apparent when a magnet is brought into the vicinity of the vertically suspended paper.

It has been noted that the magnetic properties are more pronounced when the diameter of the 316 L stainless steel fibers decreases and their length and concentration in the structure increase.

For quantitative measurements of the electrical conductivity, an apparatus for measuring the surface resistivity has been used, comprising a system of concentric electrodes as illustrated in FIG. 1. This apparatus comprises a first central electrode (1) in the form of a cylindrical copper bar and a second electrode (2) in the form of a copper ring disposed concentrically about the central bar (1) and spaced from it by appropriate pieces (3) of an insulating material, such as polyethylene. The paper sheet (4) is placed on a plate (5) of insulating material (for example teflon) and the apparatus is placed on it.

A paper containing no metallic fibers exhibits a surface resistivity exceeding $10^{12}$ ohm/demy, whereas the specimen according to example 2 exhibits a mean resistivity of $7 \times 10^9$ ohm/demy.

Figure 2:
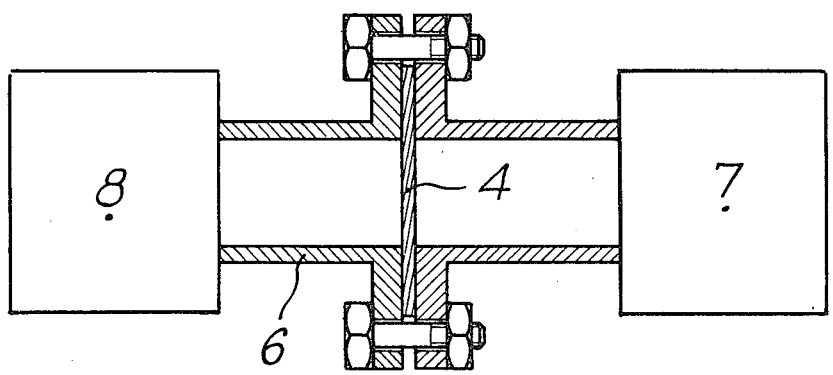

A supplementary measurement enabling the paper to be authenticated in any circumstances consists of exposing it to electromagnetic radiation, more particularly to microwave radiation, in an apparatus of the type shown in FIG. 2. This detection apparatus comprises an electromagnetic wave source (8), to which there is connected a tube (6) designed for guiding the waves emitted by said source. A detector (7) is provided at the other end of the tube (6). The specimen (4) of paper to be examined is mounted transversely in the tube (6) so that the radiation shall be projected perpendicularly onto the paper. Where the irradiation is provided by microwaves, the source (8) may be a magnetron of frequency 2.45 GHz. Measurements are taken, firstly of the radiation energy $P_i$ emitted and applied onto the paper, and secondly of the energy $P_t$ passing through the paper and also of the reflected energy $P_r$. The reflection loss value $R = 10 \log P_i/(P_i - P_r)$ and the absorption loss value $A = 10 \log (P_i - P_r)/P_t$ (expressed in dB) depend generally upon the composition of the metallic fibers, their dimensions and the concentrations in the paper. Thus, for the paper obtained according to the method of example 2, the following values were found for nine specimens: $0.6 \text{ dB} \leq R \leq 0.8$ dB and $0.3 \text{ dB} \leq A \leq 0.4$ dB when the paper was oriented in one direction and for an orientation perpendicular to the preceding, values were noted of $0.6 \text{ dB} \geq R \geq 0.3$ dB and $0.2 \text{ dB} \leq A \leq 0.4$ dB. This indicates that the metallic fibers have a preferential orientation in the direction of travel of the sheet during its production. (This fact is evident also in the magnetic measurements described below).

Finally, the magnetic induction (the density of the magnetic flux) of the paper is measured using a unidirectional probe magnetometer of the type C.D.C. with recorder. The paper is passed beneath the probe at a distance of 20 mm and the apparatus records a magnetic flux density of 1.5 nT. The paper is then turned in its own plane through 90° and is again passed beneath the probe. The value recorded for the magnetic flux was 3.5 nT.

The values of the magnetic flux densities are much higher when the paper has previously been submitted to magnetisation. In the case of example 2, the values then rise to 332 nT and 688 nT after the specimen has been reoriented through 90°. In order to maintain good reproducibility of the readings, it is therefore advantageous to magnetise the fibers to saturation before measuring the magnetic induction, althrough it has been noted that the values measured maintain their level fairly well with time. It has also been found that, even at a very low concentration of metallic fibers in the paper (notably 0.5%), it is possible to detect the magnetic induction after magnetisation.

Papers having different compositions were prepared according to the methods of examples 1 to 6 above. The mean values for the surface resistivity, absorption loss A, electromagnetic wave reflection loss R and magnetic flux density, in the direction of movement of the sheet during its formation and also in the perpendicular direction, have been recorded in tables I and II below, where table I relates o metallic fibers with a diameter of $12\mu$ and table II relates to metallic fibers with a diameter of $22\mu$.

Using the same technique it is possible notably to prepare other papers comprising metallic fibers and possessing respectively the following characteristics (diameter; length; concentration with respect to the weight of the paper):

(a) $12\mu$; 3 mm; 80%
(b) $12\mu$; 5 mm; 80%
(c) $22\mu$; 3 mm; 25%
(d) $22\mu$; 3 mm; 80%
(e) $22\mu$; 5 mm; 25%

(f) 22μ; 5 mm; 80%
and then to determine the parameters relating to the surface resistivity, the absorption loss A and reflection loss B, and the magnetic induction.

TABLE I

| Length of fibers (mm) | % by wt. metallic fibers in paper | Surface Resistivity Ω/□ | R (dB) 0° | R (dB) 90° | A (dB) 0° | A (dB) 90° | Magnetic inductance (nT) Without previous magnetizaton 0° | Without previous magnetizaton 90° | After previous magnetization 0° | After previous magnetization 90° |
|---|---|---|---|---|---|---|---|---|---|---|
| 3 | 25 | — | 6.5 | 6.5 | 14 | 14 | 49 | 78 | 1940 | 2320 |
| 5 | 5 | 8.5 · 10⁷ | 3.5 | 3 | 4.5 | 3 | 3 | 6 | 444 | 608 |
| 5 | 25 | 2.75 · 10² | 7 | 8 | 14 | 17 | 64 | 124 | 1880 | 3920 |

TABLE II

| Length of fibers (mm) | % by wt. metallic fibers in paper | Surface Resistivity Ω/□ | R (dB) 0° | R (dB) 90° | A (dB) 0° | A (dB) 90° | Magnetic inductance (nT) without previous magnetization 0° | without previous magnetization 90° | After previous magnetization 0° | After previous magnetization 90° |
|---|---|---|---|---|---|---|---|---|---|---|
| 3 | 5 | 4.48 · 10¹⁰ | 0 | 0 | 0 | 0 | 0.5 | 1 | 288 | 383 |
| 5 | 5 | 2.23 · 10¹⁰ | 0.2 | 0.1 | 0 | 0 | 1.5 | 1 | 272 | 452 |

The devices for detecting and/or measuring the electrical conductivity, the electromagnetic absorption power and electromagnetic reflection power and the magnetic flux density can, of course, be combined.

Finally, the following applications are recommended for the fibrous structures according to this invention.

(A) Security Paper

These fibrous structures can be used as security paper, notably for banknotes, deeds and official documents, such as identity cards and passports.

(B) Filter Paper

The fibrous structures according to this invention can be used as filter paper, as a filtering element for a magnetic filter, such as described notably in French Pat. No. 1,214,348, as a sheet for protection against electromagnetic waves.

A minimum proportion of metallic fibers in a flitering paper comprising a majority of synthetic fibers is capable of rendering the paper antistatic, which is of importance particularly for the filtration of gases comprising explosive compositions. Antistatic papers for other applications are also of interest, notably as sleeves for records, for films, for slides or as a covering for plastic pipes.

In addition, the fibrous structures containing lead fibers can be used for absorbing notably gamma rays.

(C) Electrodes

For the production of electrodes, it is advantageous to use fibrous structures according to this invention containing at least 80% by weight of metallic fibers, in order to achieve an appropriate electrical conductivity.

(D) Miscellaneous

Papers having a high content of metallic fibers can also be used for fuses.

I clam:

1. A method for the preparation of a fibrous structure comprising metallic fibers by the use of papermaking techniques, said method comprising the steps of:
   (a) preparing agglomerates of metallic fibers and a hydrosoluble binding agent by coating said fibers with said binder by:
      (i) subjecting a bundle of metallic fibers to a bath of the hydrosoluble binding agent to produce a coated bundle,
      (ii) drying said coated bundle, and
      (iii) cutting the coated bundle to produce said agglomerates comprising metallic fibers having a length less than or equal to about 10 mm, wherein said metallic fibers having a mean diameter less than or equal to about 30 microns, and said hydrosoluble binding agent is selected from the group consisting of polyvinyl alcohol and starch;
   (b) preparing a homogeneous aqueous dispersion by mixing said agglomerates with non-metallic fibers and water to uniformly disperse said agglomerates into fibers; and
   (c) forming a fibrous structure in the form of a sheet by wet papermaking process from said aqueous dispersion.

2. The method of claim 1, wherein the duration of step (b) is between 15 and 30 minutes.

3. The method of claim 1, wherein the non-metallic fibers of step (b) comprise polyvinyl alcohol fibers.

4. The method of claim 1, wherein the non-metallic fibers of step (b) comprise cellulose fibers.

* * * * *